(12) United States Patent
Annamalai

(10) Patent No.: US 10,427,974 B2
(45) Date of Patent: Oct. 1, 2019

(54) GLASS COMPOSITE FOR USE IN EXTREME ULTRA VIOLET LITHOGRAPHY

(71) Applicant: Corning Incorporated, Corning, NY (US)

(72) Inventor: Sezhian Annamalai, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 183 days.

(21) Appl. No.: 15/559,958

(22) PCT Filed: Mar. 22, 2016

(86) PCT No.: PCT/US2016/023557
§ 371 (c)(1),
(2) Date: Sep. 20, 2017

(87) PCT Pub. No.: WO2016/154190
PCT Pub. Date: Sep. 29, 2016

(65) Prior Publication Data
US 2018/0105452 A1    Apr. 19, 2018

Related U.S. Application Data

(60) Provisional application No. 62/138,483, filed on Mar. 26, 2015.

(51) Int. Cl.
*B32B 17/06* (2006.01)
*C03C 10/00* (2006.01)
(Continued)

(52) U.S. Cl.
CPC ............ *C03C 10/0009* (2013.01); *B32B 3/28* (2013.01); *B32B 5/16* (2013.01); *B32B 5/30* (2013.01); *B32B 7/04* (2013.01); *B32B 17/06* (2013.01); *B32B 37/04* (2013.01); *C03B 19/066* (2013.01); *C03B 23/203* (2013.01); *C03B 32/02* (2013.01);
(Continued)

(58) Field of Classification Search
USPC .................................................. 428/426, 428
See application file for complete search history.

(56) References Cited

U.S. PATENT DOCUMENTS 3,690,855 A    9/1972   Schultz
6,289,695 B1   9/2001   Swierkowski et al.
(Continued)

FOREIGN PATENT DOCUMENTS

| JP | 2010163289 A | 7/2010 |
|---|---|---|
| JP | 2010163347 A | 7/2010 |
| WO | 2009106305 A2 | 9/2009 |

OTHER PUBLICATIONS

English Translation of JP2017549726 Office Action dated Jan. 16, 2019, Japan Patent Office, 7 Pgs.
(Continued)

*Primary Examiner* — Lauren R Colgan

(57) ABSTRACT

A glass composite for use in Extreme Ultra-Violet Lithography (EUVL) is provided. The glass composite includes a first silica-titania glass section. The glass composite further includes a second doped silica-titania glass section mechanically bonded to a surface of the first silica-titania glass section, wherein the second doped silica-titania glass section has a thickness of greater than about 1.0 inch.

20 Claims, 1 Drawing Sheet

(51) Int. Cl.

| | | |
|---|---|---|
| *C03C 3/06* | (2006.01) | |
| *C03C 27/06* | (2006.01) | |
| *C03B 23/203* | (2006.01) | |
| *G02B 5/08* | (2006.01) | |
| *C03B 19/06* | (2006.01) | |
| *C03B 32/02* | (2006.01) | |
| *B32B 5/16* | (2006.01) | |
| *B32B 5/30* | (2006.01) | |
| *B32B 7/04* | (2019.01) | |
| *B32B 3/28* | (2006.01) | |
| *B32B 37/04* | (2006.01) | |
| *C03C 3/076* | (2006.01) | |
| *G03F 1/60* | (2012.01) | |
| *G02B 1/00* | (2006.01) | |

(52) U.S. Cl.
CPC ............... *C03C 3/06* (2013.01); *C03C 3/076* (2013.01); *C03C 27/06* (2013.01); *G02B 1/00* (2013.01); *G02B 5/0891* (2013.01); *G03F 1/60* (2013.01); *B32B 2260/025* (2013.01); *B32B 2260/04* (2013.01); *B32B 2264/101* (2013.01); *B32B 2264/102* (2013.01); *B32B 2264/12* (2013.01); *B32B 2307/30* (2013.01); *B32B 2307/416* (2013.01); *B32B 2307/704* (2013.01); *B32B 2307/732* (2013.01); *B32B 2551/00* (2013.01); *C03B 2201/06* (2013.01); *C03B 2201/42* (2013.01); *C03C 2201/10* (2013.01); *C03C 2201/11* (2013.01); *C03C 2201/12* (2013.01); *C03C 2201/23* (2013.01); *C03C 2201/28* (2013.01); *C03C 2201/42* (2013.01); *C03C 2203/50* (2013.01); *C03C 2203/52* (2013.01); *C03C 2204/00* (2013.01)

(56) References Cited

U.S. PATENT DOCUMENTS

| | | | |
|---|---|---|---|
| 6,487,879 | B1 | 12/2002 | Blackwell et al. |
| 6,796,143 | B2 | 9/2004 | Clasen et al. |
| RE40,586 | E | 11/2008 | Hrdina et al. |
| 7,589,040 | B2 | 9/2009 | Dawes et al. |
| RE41,220 | E | 4/2010 | Davis Jr. et al. |
| 7,989,378 | B2 | 8/2011 | Koike et al. |
| 8,021,755 | B2 | 9/2011 | Hrdina et al. |
| 8,034,731 | B2 | 10/2011 | Koike et al. |
| 8,093,165 | B2 | 1/2012 | Koike et al. |
| 8,328,417 | B2 | 12/2012 | Duran |
| 8,541,325 | B2 | 9/2013 | Duran et al. |
| 8,713,969 | B2 | 5/2014 | Duran et al. |
| 8,901,019 | B2 | 12/2014 | Annamalai et al. |
| 9,034,450 | B2 | 5/2015 | Annamalai |
| 9,416,040 | B2 | 8/2016 | Kuehn |
| 9,505,649 | B2 | 11/2016 | Duran |
| 9,611,169 | B2 | 4/2017 | Annamalai et al. |
| 2004/0045318 | A1 | 3/2004 | Hrdina et al. |
| 2006/0179879 | A1 | 8/2006 | Ellison et al. |
| 2010/0317505 | A1 | 12/2010 | Koike et al. |
| 2011/0207592 | A1* | 8/2011 | Duran .................... B82Y 10/00 501/54 |
| 2011/0207593 | A1* | 8/2011 | Duran ................. C03B 19/1407 501/54 |
| 2012/0321999 | A1* | 12/2012 | Mitsumori ................ G03F 1/24 430/5 |
| 2013/0047669 | A1* | 2/2013 | Annamalai ............. C03B 19/06 65/17.6 |
| 2013/0052391 | A1* | 2/2013 | Annamalai ............. G03F 1/146 428/67 |
| 2014/0155246 | A1* | 6/2014 | Annamalai ............... C03C 3/06 501/54 |
| 2014/0199494 | A1 | 7/2014 | Genier |
| 2015/0080206 | A1* | 3/2015 | Duran .................... C03B 25/02 501/54 |
| 2015/0218039 | A1* | 8/2015 | Angell, IV ................ G03F 1/60 501/54 |
| 2015/0259239 | A1* | 9/2015 | Annamalai ............... C03C 3/06 501/54 |
| 2016/0168010 | A1* | 6/2016 | Annamalai ......... C03B 19/1453 501/54 |
| 2016/0236965 | A1* | 8/2016 | Annamalai ............. C03B 25/00 |
| 2017/0144917 | A1* | 5/2017 | Annamalai ............. C03C 3/089 |

OTHER PUBLICATIONS

Conzone, S. et al., "Low-Temperature Joining of Zerodur and SiO2 for Optical Device Manufacture." Inorganic Optical Materials III, Proceedings of SPIE, vol. 4452, 2001.

International Search Report and Written Opinion of the International Searching Authority; PCT/US2016/023557; dated Jun. 29, 2016; 13 Pages; European Patent Office.

* cited by examiner

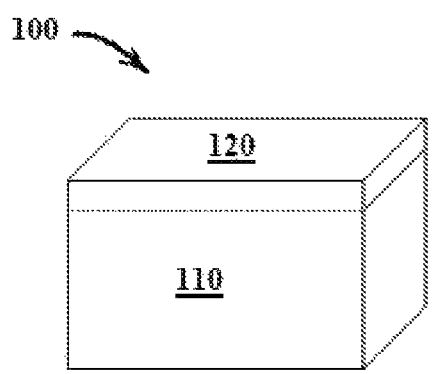

GLASS COMPOSITE FOR USE IN EXTREME ULTRA VIOLET LITHOGRAPHY

This is a national stage application under 35 U.S.C. § 371 of International Application No. PCT/US2016/023557, filed on Mar. 22, 2016, which claims the benefit of priority to U.S. Application No. 62/138,483 filed on Mar. 26, 2015 the content of which is incorporated herein by reference in its entirety.

FIELD

The present disclosure relates to a bonded silica-titania composite. More particularly, the present disclosure relates to a glass composite having a doped silica-titania glass section mechanically bonded to a silica-titania glass section.

BACKGROUND

Extreme Ultra-Violet Lithography (EUVL) is a leading emerging technology for 13 nm mode and beyond for the production of Micro Processing Unit and Dynamic Random Access Memory (MPU/DRAM) integrated chips. Presently, EUVL scanners which produce these Integrated Chips (ICs) are used on a small scale for purposes of evaluating and demonstrating this new technology. The optics systems, which include reflective optical elements, are an important part of these scanners. As EUVL development proceeds towards high volume manufacture, the specifications are expected to continue to become more stringent for the optics system parts.

In EUVL scanners, the optical elements are exposed to an intense extreme ultraviolet (EUV) radiation having a wavelength of 13.5 nm. Some portion of this EUV radiation is absorbed by the reflective coatings on the optical elements of the systems, which results in the heating of the top surface of the optical element. This causes the surface of the optical element to be hotter than the bulk of the optical element and results in a temperature gradient through the optical element. In addition, in order to image a pattern on semiconductor wafers, the surface of the optical element is not uniformly exposed to the EUV radiation, which leads to a temperature gradient on the optical surface. This results in a complex three dimensional temperature gradient through the thickness of the optical element, as well as along the optical element surface receiving the radiation. These temperature gradients lead to a distortion of the optical element, which in turn leads to smearing of the image being formed on the wafers. It is expected that the difficulties of heat dissipation will be exacerbated by the increased optical element sizes and the increased power levels that are anticipated to meet the demands of future EUVL developments.

SUMMARY

According to an embodiment of the present disclosure, a glass composite for use in Extreme Ultra-Violet Lithography (EUVL) is provided. The glass composite includes a first silica-titania glass section. The glass composite further includes a second doped silica-titania glass section mechanically bonded to a surface of the first silica-titania glass section, wherein the second doped silica-titania glass section has a thickness of greater than about 1.0 inch.

According to another embodiment of the present disclosure, a method for forming a glass composite for use in Extreme Ultra-Violet Lithography (EUVL) is provided. The method includes forming a first silica-titania glass section, forming a second silica-titania glass section, and doping the second silica-titania glass section to form a doped silica-titania glass section. The method further includes mechanically bonding the doped silica-titania glass section to a surface of the first silica-titania glass section. The doped silica-titania glass section has a thickness of greater than about 1.0 inch.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The disclosure will be understood more clearly from the following description and from the accompanying FIG-URES, given purely by way of non-limiting example, in which:

FIG. 1 illustrates a bonded silica-titania composite in accordance with embodiments of the present disclosure.

DETAILED DESCRIPTION

Reference will now be made in detail to the present embodiment(s), an example(s) of which is/are illustrated in the accompanying drawings. Whenever possible, the same reference numerals will be used throughout the drawings to refer to the same or like parts.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

Glass composites capable of use for photolithography, and methods of forming such glass composites, are provided herein. As used herein, the term "glass composite" refers to a glass article having at least two glass sections that differ in chemical composition, where the individual glass materials remain separate and distinct in the finished structure of the glass article. FIG. 1 illustrates a bonded silica-titania composite 100 in accordance with embodiments of the present disclosure. As shown, the bonded silica-titania composite 100 has a length $L_c$, a width $W_c$ and a thickness $T_c$. The bonded silica-titania composite 100 includes a first glass section 110 and a second glass section 120 bonded to the first glass section 110. The second glass section 120 may be mechanically bonded to the first glass section 110 using fusion bonding, frit bonding or low temperature sol-gel bonding. The first glass section 110 and the second glass section 120 have substantially equal lengths and widths that are substantially equal to the length $L_c$ and the width $W_c$ of the silica-titania composite 100. The first glass section 110 has a thickness $T_1$ of between about 1.0 inch and about 12 inches. For example, the first glass section 110 may have a thickness $T_1$ of between about 3.0 inches and about 10 inches. The second glass section 120 has a thickness $T_2$ of at least about 1.0 inch. For example, the second glass section 120 has a thickness $T_2$ between about 1.0 inch and about 2.0 inches, or even between about 1.25 inches and about 2.0 inches.

The bonded silica-titania composite 100 has a thickness $T_c$ of between about 2.0 inches and about 14 inches. For example, the silica-titania composite 100 may have a thickness $T_c$ between about 4.0 inches and about 12 inches. According to embodiments of the present disclosure, the first glass section 110 may comprise greater than about 50% of the thickness $T_c$ of the silica-titania composite 100. For example, the first glass section 110 may comprise between about 50% and about 95%, or between about 70% and about 90% of the thickness $T_c$ of the silica-titania composite 100. The bonded silica-titania composite 100 has a mass of greater than about 20 kg. For example, the silica-titania composite 100 may have a mass of greater than about 30 kg, or even greater than about 120 kg or more.

The first glass section 110 is a silica-titania glass containing between about 1.0 wt. % and about 16 wt. % titania and having a near-zero coefficient of thermal expansion (CTE) in a temperature range of about 25° C. and about 35° C. A material that has near-zero thermal CTE is one that undergoes little or no dimensional change in response to changing temperature. The slope of CTE versus temperature at 20° C. of the first glass section 110 is less than about 1.6 ppb/K$^2$ at 20° C., for example, less than about 1.3 ppb/K$^2$, or less than about 1.0 ppb/K$^2$. As described in further detail below, the CTE properties of the first glass section 110 are tailored to substantially match the CTE properties of the second glass section 120. The first glass section 110 may have, for example, between about 5.0 wt. % and about 16 wt. % titania, or between about 10 wt. % and about 16 wt. % titania. At least a portion of the titania in the first glass section 110 is in crystalline form with the crystalline form being predominantly anatase.

The second glass section 120 is a doped silica-titania glass containing between about 1.0 wt. % and about 14 wt. % titania. The second glass section 120 may have, for example, between about 5.0 wt. % and about 13 wt. %. titania, or between about 8.0 wt. % and about 12 wt. % titania. The second glass section 120 may also include between about 1.0 wt. % and about 10 wt. % of at least one dopant, or between about 1.0 wt. % and about 6.0 wt. % of at least one dopant. The at least one dopant may include, but is not limited to, boron, fluorine, chlorine, phosphorous, hydroxyl groups and mixtures thereof. The doped silica-titania glass has a uniform composition in which the variation of the titania concentration through the thickness of the glass is less than about 0.20 wt. %, and the variation of dopant concentration through the thickness of the glass is less than about 0.20 wt. %. The variations of the concentration of titania and of the at least one dopant in the second glass section 120 provides a uniformity that renders the second glass section 120 highly polishable.

The second glass section 120 has a near-zero CTE in a temperature range of about 25° C. and about 35° C., and a slope of CTE versus temperature at 20° C. of less than about 1.6 ppb/K$^2$. For example, the slope of CTE versus temperature at 20° C. may be less than about 1.3 ppb/K$^2$, or even less than about 1.0 ppb/K$^2$. The second glass section 120 may also have a CTE uniformity having a variation that is less than about 10 ppb/K. For example, the CTE variation may be less than about 5.0 ppb/K, or even less than about 1.0 ppb/K.

In accordance with embodiments of the present disclosure, the second glass section 120 may include a curved reflective surface which is intended to receive impinging radiation. For example, the curved reflective surface may be an aspherical surface formed by machining and/or grinding a surface of the second glass section 120. The uniform composition of the second glass section 120 renders the surface that is intended to receive impinging radiation capable of being finished to a surface roughness that meets EUVL specifications, such as a Mid-Spatial Frequency Roughness ("MSFR") of less than about 0.2 nm rms. For example, the surface of the second glass section 120 that is intended to receive impinging radiation may have an MSFR of less than about 0.15 nm rms, less than about 0.12 nm rms, or even less than about 0.10 nm rms.

A method for forming a bonded silica-titania composite 100 is provided herein. The method includes forming a first glass section 110 of silica-titania glass. The silica-titania glass of the first glass section 110 may be formed in accordance with a one-step process (the direct process) or a two-step process (the indirect process). Each of the one-step and the two step processes include transporting vaporous reactants to a reaction site, such as a burner, via a carrier gas, wherein the vaporous gas streams are combusted in a burner flame fueled with natural gas and oxygen. The presence of oxygen serves to convert the vaporous reactants to their respective oxides upon exiting the burner orifice to form a stream of volatile gases and finely-divided, spherical particles of soot that are deposited onto a substrate, forming a porous blank, or preform, of soot. In the one-step process, the temperature is maintained at a consolidation temperature so that the particles are formed and consolidated into glass substantially simultaneously. In the two-step process, the blank, or preform, is formed in a first step as described above and heat treated in a second step in a helium/chlorine atmosphere to full consolidation. The direct process is described in U.S. Pat. Nos. 8,541,325, RE41220 and 7,589,040, and the indirect process is described in U.S. Pat. No. 6,487,879, the specifications of which are hereby incorporated by reference in their entirety. Apparatuses which may be used in the direct and indirect processes are described in U.S. Pat. No. RE40,586 and U.S. Patent Application No. 2011-0207593, the specifications of which are incorporated by reference in their entirety.

As formed, the silica-titania glass of the first glass section 110 has a negative CTE which may be modified by heat treatment. As such, the method further includes heat treating the silica-titania glass of the first glass section 110 to form a crystalline form of titania with the crystalline form being predominantly anatase. Heat treating includes heating the silica-titania glass of the first glass section 110 to a temperature of between about 700° C. and about 1000° C. for a period of between about 1.0 hour and about 10 hours. The formation of the anatase crystals, which are known to have a positive CTE, neutralizes the CTE of the silica-titania glass as formed. Thus, the heat treating step provides the first glass section 110 with a near-zero CTE.

The temperature and time period of the heat treating step may be selected to crystalize a predetermined amount of titania crystals in order to substantially match the CTE of the first glass section 110 with the CTE of the second glass section 120. For example, where the second glass section 120 has a near-zero CTE, heat treating the silica-titania glass of the first glass section 110 may provide the first glass section 110 with a near-zero CTE as well. The difference between the CTE of the first glass section 110 and the CTE of the second glass section 120 may be less than about 5.0 ppb/K, or less than about 3.0 ppb/K. Matching the CTE of the first glass section 110 and the second glass section 120 prevents stresses during bonding of the two sections that result from CTE differences. Furthermore, matching the CTE of the first glass section 110 and the second glass section 120 provides uniform thermal expansion properties through the thickness $T_c$ of the bonded silica-titania composite 100, which in turn minimizes temperature-related distortions and enables use of the bonded silica-titania composite 100 in EUVL applications.

The method may optionally further include polishing a surface of the first glass section HO to prepare the first glass section 110 for bonding to a surface of the second glass section 120.

The method further includes forming a second glass section 120 of doped silica-titania glass. The doped silica-titania glass of the second glass section 120 may be formed using "wet" processes, such as sol-gel processes in which silica and titania particles, or silica-titania soot particles having a predetermined concentration of titania and at least one dopant precursor, are dispersed in water and/or other solvents to form a sol that is aged, or mixed with a chemical composition, to induce gelation thereof. The gel is then dried and subjected to a thermal treatment in order to remove organic substances from the gel. The resultant gel may then be subjected to an additional thermal treatment to remove hydroxyl groups and to sinter the gel to form a glass article. Alternatively, the doped silica-titania glass of the second glass section 120 may be formed using silica-titania soot particles having a predetermined concentration of titania and at least one dopant precursor by dissolving the at least one dopant precursor in water or other solvents and mixing the silica-titania soot particles to form a slurry. The slurry may then be spray dried to form doped silica-titania powder which may then be dry pressed and consolidated to form a glass article. The doped silica-titania glass of the second glass section 120 may also be formed using chemical vapor deposition (CVD) processes, such as outside vapor deposition (OVD), in which vaporous reactants are transported to a reaction site, such as a burner, via a carrier gas, wherein the vaporous gas streams are combusted in a burner flame fueled with natural gas and oxygen. The presence of oxygen serves to convert the vaporous reactants to their respective oxides upon exiting the burner orifice to form a stream of volatile gases and finely-divided, spherical particles of soot that are deposited onto the surface of a rotating mandrel to form a preform of soot. The preform is then dried and sintered to form a glass article. The doped silica-titania glass of the second glass section 120 may also be formed using soot pressing processes in which soot particles containing silica, titania and at least one dopant are formed using a CVD process. The soot particles are collected in a mold and pressure is applied to form a soot compact. The soot compact is then sintered to form a doped glass article.

In any of the processes discussed above, the silica and titanic particles and/or soot may be doped by adding particles of the at least one dopant prior to the formation of the doped silica-titania glass. Similarly, where a soot compact is formed using a soot pressing process, the soot compact may be doped by being contacted with at least one dopant gas after formation of the soot compact and/or during a pre-sintering step where the soot compact is placed in a closed system and heated to a temperature below a sintering temperature. For example, the soot compact may be heated to a temperature of less than about 1200° C. The at least one dopant may include, but are not limited to, boron, fluorine, chlorine, phosphorous, hydroxyl groups and mixtures thereof. Without wishing to be limited by any particular theory, it is believed that the dopant can reduce glass viscosity, which reduces fictive temperature, and, in turn, reduces the slope of CTE versus temperature.

The method may further include annealing the doped silica-titanic glass of the second glass section 120. Following consolidation, the glass article may be cooled to a holding temperature of less than about 1000° C., for example, between about 600° C. and about 1000° C., for a holding period of at least about 30 minutes, for example, between about 30 minutes and about 2.0 hours. After completion of the holding period, the temperature may be decreased to a predetermined temperature, between about 600° C. and about 850° C., at a rate of less than about 10° C. per hour. For example, the rate may be between about 0.10° C. per hour and about 10° C. per hour, or between about 0.10° C. per hour and about 5.0° C. per hour, or even between about 0.10° C. per hour and about 3.0° C. per hour. Once the predetermined temperature is reached, heat from a heat source may be removed, and the temperature may be allowed to cool to ambient temperature. Annealing the glass article as disclosed herein provides control of the CTE and the slope of CTE versus temperature of the doped silica-titania glass and achieves high spatial uniformity of thermal expansion properties. Annealing the doped silica-titania glass of the second glass section 120 in accordance with the method described herein further reduces the slope of CTE versus temperature of the doped silica-titania glass. In combination with the effect of the at least one dopant, annealing the doped silica-titania glass of the second glass section 120 can reduce the slope of CTE versus temperature by greater than about 40% as compared to undoped silica-titania glass. For example, annealing the doped silica-titania glass of the second glass section 120 can reduce the slope of CTE versus temperature by greater than about 50% as compared to undoped silica-titania glass.

The method may optionally further include polishing a surface of the second glass section 120 to prepare the second glass section 120 for bonding to a surface of the first glass section 110.

The method further includes mechanically bonding a surface of the second glass section 120 to a surface of the first glass section 110. Bonding may be performed using fusion bonding in which a welded interface is formed between the two glass sections by bringing the surfaces of the glass sections into contact, and heating the surfaces to a temperature near the softening point of the glass sections. Bonding may also be performed using frit bonding in which a frit, or a glass material having a melting temperature below the melting temperature of the glass sections, is placed between the surfaces of the glass sections. The frit is then melted by being heated by an irradiation source, such as a laser or infrared light, and then is cooled to form a hermetic seal that connects the second glass section 120 to the first glass section 110. The frit may be doped with a material that lowers the CTE of the frit so that the frit softens and forms a bond at lower temperatures and avoids thermal damage to the glass sections. Where frit bonding is used, the frit may be selected to have a CTE that substantially matches the CTE of the first glass section 110 and the second glass section 120. Optionally, the frit may include CTE modifying additives which further allow the CTE of the frit match the CTE of the first glass section 110 and the second glass section 120. Bonding may also be performed using low temperature sol-gel bonding where a sol-gel resin is produced and, after being subjected to a curing process, forms a final glass-like film. At least one of the surfaces to be bonded is coated with the glass-like film and the sol-gel layer is cured (either thermally or using UV irradiation) to form a bond between the first glass section 110 and the second glass section 120.

Once the second glass section 120 is bonded to a surface of the first glass section 110, the surface of the second glass section 120 opposite the surface bonded to the first glass section 110 may be subjected to machining and/or grinding to form a curved reflective surface. For example, the curved reflective surface may be an aspherical surface formed by machining and/or grinding a surface of the second glass section 120.

Bonded silica-titania glass composites according to the present disclosure may be formed to have dimensions large enough to be used in EUVL applications. Such large composites include a first section of glass having a thickness comprising greater than about 50% of the thickness of the composite which can be formed using cost effective and time efficient processes. The large composites also include a second section of glass having a thickness comprising less than about 50% of the thickness of the composite which has a uniform composition that renders the section of glass highly polishable and capable of being finished to a surface roughness that meets EUVL specifications. Additionally, the bonded silica-titania glass composites also have thermal expansion properties that allow for their use in EUVL applications.

It will be apparent to those skilled in the art that various modifications and variations can be made without departing from the spirit or scope of the claims.

What is claimed is:

1. A glass composite for use in Extreme Ultra-Violet Lithography (EUVL), the glass composite comprising:
   a first silica-titania glass section; and
   a second doped silica-titania glass section mechanically bonded to a surface of the first silica-titania glass section,
   wherein the second doped silica-titania glass section has a thickness of greater than about 1.0 inch.

2. The glass composite of claim 1, wherein the first silica-titania glass section comprises between about 5.0 wt. % and about 16 wt. % titania.

3. The glass composite of claim 1, wherein the titania of the first silica-titania glass section comprises a crystalline form, wherein the crystalline form is predominantly anatase.

4. The glass composite of claim 1, wherein the second doped silica-titania glass section comprises between about 5.0 wt. % and about 12 wt. % titania.

5. The glass composite of claim 1, wherein the second doped silica-titania glass section comprises between about 1.0 wt. % and about 10.0 wt. % of at least one dopant.

6. The glass composite of claim 5, wherein the at least one dopant is selected from the group consisting of boron, fluorine, chlorine, phosphorous, hydroxyl groups and mixtures thereof.

7. The glass composite of claim 1, wherein the second doped silica-titania glass section comprises a slope of coefficient of thermal expansion (CTE) versus temperature at 20° C. of less than about 1.6 ppb/K$^2$.

8. The glass composite of claim 1, wherein the second doped silica-titania glass section comprises a curvature machined into a surface of the second doped silica-titania glass section.

9. The glass composite of claim 1, wherein the first silica-titania glass portion comprises between about 50% and about 95% of the thickness of the bonded glass composite.

10. The glass composite of claim 1 comprising a mass greater than about 20 kg.

11. The glass composite of claim 1, wherein the first silica-titania glass section and the second doped silica-titania glass section comprise a near-zero CTE.

12. A method for forming a glass composite for use in Extreme Ultra-Violet Lithography (EUVL), the method comprising:
    forming a first silica-titania glass section;
    forming a second silica-titania glass section;
    doping the second silica-titania glass section to form a doped silica-titania glass section; and
    mechanically bonding the doped silica-titania glass section to a surface of the first silica-titania glass section,
    wherein the doped silica-titania glass section has a thickness of greater than about 1.0 inch.

13. The method of claim 12, further comprising heat treating the first silica-titania glass section to form a crystalline form of titania, wherein the crystalline form is predominantly anatase.

14. The method of claim 13, wherein heat treating the first silica-titania glass section comprises modifying the coefficient of thermal expansion (CTE) and the slope of CTE versus temperature of the first silica-titania glass section to substantially match the CTE and the slope of CTE versus temperature of the doped silica-titania glass section.

15. The method of claim 12, further comprising annealing the doped silica-titania glass section.

16. The method of claim 12, wherein forming the second silica-titania glass section comprises pressing soot particles to form a soot compact.

17. The method of claim 12, wherein the bonding step comprises fusion bonding the doped silica-titania glass section to a surface of the first silica-titania glass section.

18. The method of claim 12, wherein the bonding step comprises frit bonding the doped silica-titania glass section to a surface of the first silica-titania glass section.

19. The method of claim 12, wherein the bonding step comprises low temperature sol-gel bonding the doped silica-titania glass section to a surface of the first silica-titania glass section comprises.

20. The method of claim 12, further comprising forming a curved reflective surface on a surface of the doped silica-titania glass section.

* * * * *